United States Patent [19]

Fujisawa

[11] Patent Number: 4,801,889

[45] Date of Patent: Jan. 31, 1989

[54] AMPLIFIER FOR AMPLIFYING INPUT SIGNAL VOLTAGE AND SUPPLYING THE SAME

[75] Inventor: Masanori Fujisawa, Saitama, Japan

[73] Assignee: Sanyo Electric Co., Ltd., Osaka, Japan

[21] Appl. No.: 108,104

[22] Filed: Oct. 13, 1987

[30] Foreign Application Priority Data

Oct. 17, 1986 [JP] Japan ................................ 61-247933

[51] Int. Cl.$^4$ ................................................. A03F 1/34
[52] U.S. Cl. ....................................... 330/84; 330/295; 381/121
[58] Field of Search ...................... 330/146, 84, 124 R, 330/125, 295, 296, 267, 273, 260, 261; 381/120, 121

[56] References Cited

U.S. PATENT DOCUMENTS 4,254,380 3/1981 Guillien ........................... 330/84 X Primary Examiner—James B. Mullins
Attorney, Agent, or Firm—Darby & Darby

[57] ABSTRACT

An amplifier comprises a first amplifier circuit and a second amplifier circuit. An input signal voltage and an input DC bias voltage are applied to the first amplifier circuit, and an input DC bias voltage is applied to the second amplifier circuit. The input DC bias voltages applied to the first amplifier circuit and the second amplifier circuit are common to each other. Output bias voltages of the first amplifier circuit and the second amplifier circuit become equal to each other. The amplified signal voltages are applied to a load connected between outputs of the amplifier circuits.

15 Claims, 3 Drawing Sheets

AMPLIFIER FOR AMPLIFYING INPUT SIGNAL VOLTAGE AND SUPPLYING THE SAME

BACKGROUND OF THE INVENTION

1. Field of the Invention

The present invention relates to an amplifier and more particularly to an amplifier suitable for driving a load which is operated by an AC signal, capable of being miniaturized and having improved characteristics.

2. Description of the Prior Art

FIG. 1 illustrates an IC (integrated circuit) referred to as an LA4520 which is described in "Semiconductor Handbook, Monolithic Bipolar Integrated Circuit Edited by Sanyo Electric Co., Ltd., '85" issued Mar. 20, 1985, p. 723.

The IC is used in a headphone cassette player only for reproduction, and comprises a pre-amplifier and a power amplifier in one package.

In FIG. 1, two sets of amplifiers each comprising an amplifier circuit 1 and feedback resistors 2 and 3 are provided in one package a. In addition, the package a is provided with input terminals 4 and 5 and an output terminal 6 corresponding to each of the amplifiers. Furthermore, a power supply input terminal 7 receiving a power supply voltage Vcc and a ground terminal 8 are provided therein. Each of the amplifier circuits 1 has a negative input, a positive input and an output, the feedback resistor 2 being connected between the negative input and the output. The feedback resistor 3 is connected between the negative input of each of the amplifier circuits 1 and the corresponding input terminal 4, and the positive input thereof is connected to the corresponding input terminal 5. The output of each of the amplifier circuits 1 is connected to the corresponding output terminal 6. A virtual grounding capacitor 9 is connected between each of the input terminals 4 and a grounding conductor. An input signal source 10 is connected between each of the input terminals 5 and the grounding conductor. A coupling capacitor 11 such as an electrolytic capacitor and a load 12 such as a headphone are connected in series between each of the output terminals 6 and the grounding conductor.

A small signal voltage applied from the input signal source 10 to the input terminal 5 is amplified by the amplifier circuit 1 and outputted from the output terminal 6. Closed loop gain of the amplifier circuit 1 is determined by the feedback resistors 2 and 3. In addition, the output bias voltage is generally set to ½ Vcc so that the amplitude of a signal component of the output voltage can be increased. The DC bias of the output voltage is removed by the coupling capacitor 11, so that only the amplified signal voltage is applied to the load 12. The coupling capacitor 11 stores charges during a positive half cycle of the amplified AC signal and discharges the charges during a negative half cycle thereof, so that electric power is stored in the form of voltage.

However, in the above described conventional amplifier, capacitance of the electrolytic capacitor externally provided, particularly, the outputting coupling capacitor 11, must be increased to improve the frequency characteristics. In order to supply power to a load such as a headphone even in the range of low frequency characteristics, capacitance of the coupling capacitor 11 must be approximately 220 μF when the load resistance is 16Ω and the frequency is 45 Hz or the load resistance is 32Ω and the frequency is 22.5 Hz, for example. Therefore, the coupling capacitor 11 prevents manufacturing the miniaturized and light device. In addition, the frequency characteristics depend on the load. Furthermore, when the power supply is turned on, noise is produced by charging current for charging the coupling capacitor 11, which presents a problem when a load such as a headphone applied to ears or put in ears is driven.

SUMMARY OF THE INVENTION

A primary object of the present invention is to provide an amplifier capable of being miniaturized and having improved characteristics.

Another object of the present invention is to provide an amplifier capable of driving a load such as a headphone without using an outputting coupling capacitor.

In order to attain the above described objects, an amplifier according to the present invention comprises a first input terminal, a second input terminal, an input signal voltage being coupled between the first input terminal and the second input terminal, biasing means for applying a DC bias voltage to the input signal voltage, first amplifier means for amplifying the input signal voltage including the applied DC bias voltage, second amplifier means for amplifying the DC bias voltage, a first output signal deriving means, including a first output terminal for deriving an output signal from the first amplifier means, and a second output signal deriving means, including a second output terminal for deriving an output signal from the second amplifier means, a load being connected between the first output terminal and the second output terminal.

In accordance with an aspect of the present invention, an output impedance of the second amplifier means is lower than an impedance of the load connected between the first output terminal and the second output terminal.

In accordance with another aspect of the present invention, the first amplifier means and the second amplifier means have the same amplification degree and the same input impedance.

In the amplifier according to the present invention, a signal voltage and an input DC bias voltage are applied to the first amplifier means and only the input DC bias voltage which is equal to that applied to the first amplifier means is applied to the second amplifier means. In addition, output bias voltages of the first and second amplifier means are set to be equal to each other. Therefore, no DC current flows in the load. Furthermore, the output impedance of the second amplifier means is set to be lower than the impedance of the load. Therefore, only the signal voltage amplified by the first amplifier means is applied to the load connected between outputs.

Thus, the coupling capacitor is not required, so that the miniaturized and light device can be obtained. In addition, in the absence of the coupling capacitor, amplification is performed irrespective of the frequency, so that frequency characteristics are improved. Furthermore, when the power supply is turned on, noise is not produced, so that transient characteristics at that time are improved.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
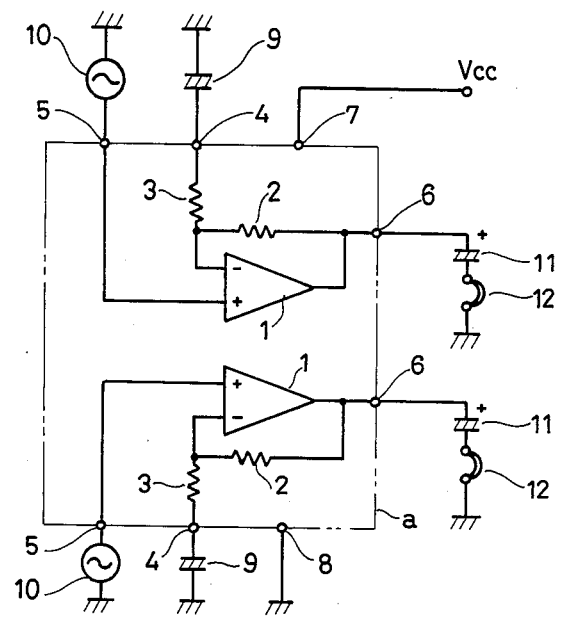
FIG. 1 is a circuit diagram showing an example of conventional amplifier.
Figure 2:
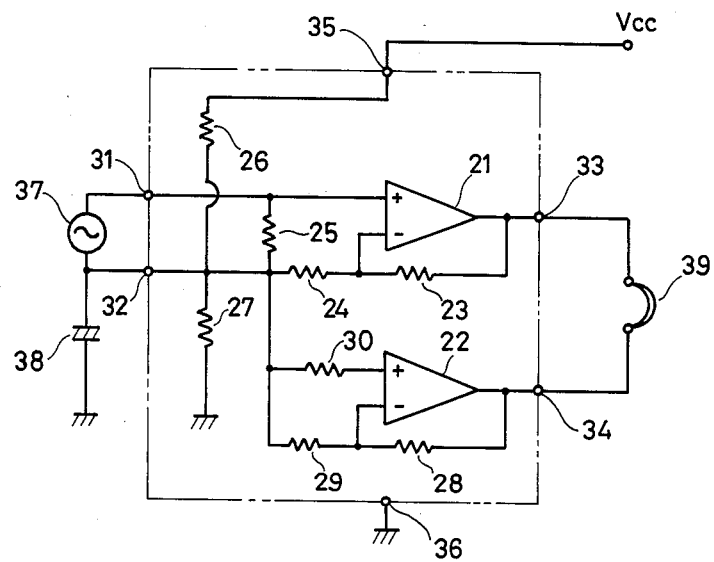
FIG. 2 is a circuit diagram of an amplifier according to an embodiment of the present invention.

FIG. 2 is a circuit diagram of an amplifier according to an embodiment of the present invention.

As shown in FIG. 2, the amplifier according to the present embodiment comprises a first amplifier circuit 21, a second amplifier circuit 22, resistors 23 to 30, a pair of input terminals 31 and 32, a pair of output terminals 33 and 34, a power supply terminal 35 and a ground terminal 36. Each of the first amplifier circuit 21 and the second amplifier circuit 22 comprises, for example, an operational amplifier. The first amplifier circuit 21 has a positive input connected to the first input terminal 31, and a negative input connected to an output thereof through the first resistor 23 for negative feedback and connected to the second input terminal 32 through the second resistor 24 for negative feedback. The output of the first amplifier circuit 21 is connected to the first output terminal 33. The third inputting resistor 25 is connected between the first input terminal 31 and the second input terminal 32. The fourth resistor 26 and the fifth resistor 27 are connected between the power supply terminal 35 and the second input terminal 32 and between the second input terminal 32 and the ground terminal 36, respectively. Input bias voltage is determined by the fourth and fifth resistors 26 and 27.

On the other hand, the second amplifier circuit 22 has a negative input connected to an output thereof through a sixth negative feedback resistor 28 and connected to the second input terminal 32 through the seventh negative feedback resistor 29. The second amplifier circuit 22 has a positive input connected to the second input terminal 32 through a eighth inputting resistor 30. The output of the second amplifier circuit 22 is connected to the second output terminal 34.

The first amplifier circuit 21 and the second amplifier circuit 22 have the identical open loop gain. The first resistor 23 and the sixth resistor 28 have the identical resistance value, the second resistor 24 and the seventh resistor 29 have the identical resistance value and the third resistor 25 and the eighth resistor 30 have the identical resistance value. Thus, since the resistance value $R_3$ of the third resistor 25 equals the resistance value $R_8$ of the eighth resistor 30, and an input impedance of the first amplifier circuit 21 is $R_3$ and an input impedance of the second amplifier circuit 22 is $R_8$, both input impedances are equal to each other. In addition, closed loop gain G of the first amplifier circuit 21 is determined by the resistance value $R_1$ of the first resistor 23 and the resistance value $R_2$ of the second resistor 24, and closed loop gain G of the second amplifier circuit 22 is determined by the resistance value $R_6$ of the sixth resistor 28 and the resistance value $R_7$ of the seventh resistor 29. When the open loop gain is sufficiently large, the closed loop gain G is as follows: $G \approx R_1/R_2 = R_6/R_7$. Furthermore, input DC bias voltages of the first amplifier circuit 21 and the second amplifier circuit 22 are determined by the fourth and fifth resistors 26 and 27 to be equal to each other.

An input signal source 37 is connected between the first input terminal 31 and the second input terminal 32, and a nominal grounding capacitor 38 is connected between the second input terminal 32 and a grounding conductor. A load 39 such as a headphone is connected between the first output terminal 33 and the second output terminal 34. When a headphone is used as the load 39, the input signal source 37 is a circuit for outputting a sound signal. A small signal voltage from the input signal source 37 and an input DC bias voltage caused by the fourth and fifth resistors 26 and 27 are applied to the first amplifier circuit 21, and only an input DC bias voltage is applied to the second amplifier circuit 22. Since the input DC bias voltages applied to the first amplifier circuit 21 and the second amplifier circuit 22 are equal to each other, and the closed loop gains of the first amplifier circuit 21 and the second amplifier circuit 22 are equal to each other, DC output voltages derived from the first and second output terminals 33 and 34 are equal to each other. Thus, only the signal voltage amplified in the first amplifier circuit 21 is applied to both ends of the load 39, so that no DC current flows in the load 39. Current flows from the output of the first amplifier circuit 21 to the output of the second amplifier circuit 22 during a positive half cycle of the signal voltage, and current is extracted from the output of the second amplifier circuit 22 to the output of the first amplifier circuit 21 during a negative half cycle, constituting one cycle.

In the amplifier according to the present embodiment, an outputting coupling capacitor is not employed, so that an output signal is independent of the frequency. Thus, a wide-band amplifier capable of obtaining flat frequency characteristics even at a low frequency is obtained. Furthermore, since amplification is performed by the first amplifier circuit 21 and the second amplifier circuit 22 with the identical transient characteristics, no current flows in the load 39 when the power supply is turned on, so that noise is not produced.

Additionally, the nominal grounding capacitor 38 operates as a filter against a ripple. However, amplified outputs of the first amplifier circuit 21 and the second amplifier circuit 22 are in phase with each other, so that the effect of the ripple is removed.

Figure 3:
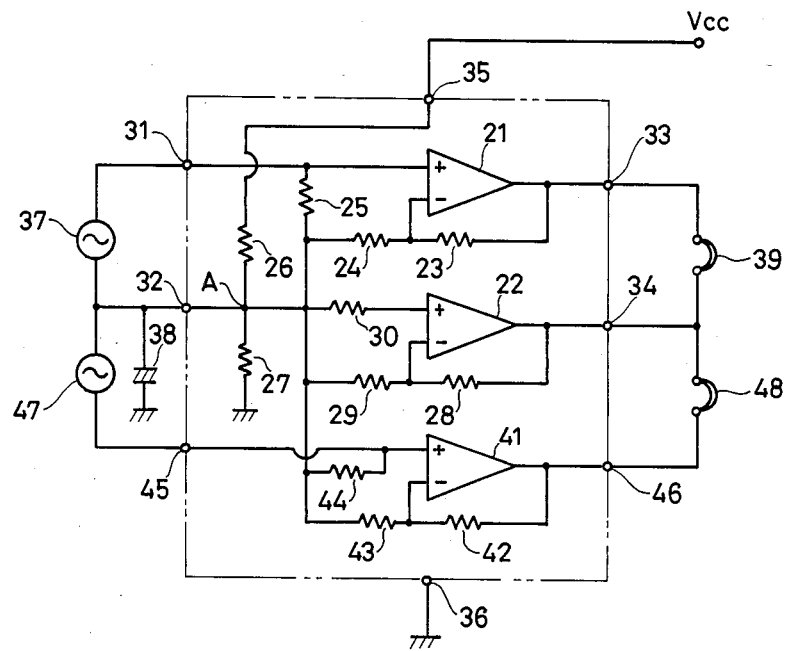
FIG. 3 is a circuit diagram of an amplifier according to another embodiment of the present invention.

FIG. 3 is a circuit diagram of an amplifier according to another embodiment of the present invention. The amplifier is used for driving a stereo headphone. The same portions as those in the embodiment shown in FIG. 2 have the same reference numerals and therefore, the description thereof is omitted.

The amplifier according to the present embodiment comprises a third amplifier circuit 41 comprising, for example, an operational amplifier, resistors 42 to 44, a third input terminal 45 and a third output terminal 46, in addition to a first amplifier circuit 21, a second amplifier circuit 22, resistors 23 to 30, a pair of input terminals 31 and 32, a pair of output terminals 33 and 34, a power supply terminal 35 and a ground terminal 36 which are included in the amplifier shown in FIG. 2. The third amplifier circuit 41 has a positive input connected to the third input terminal 45, and a negative input connected to an output thereof through the ninth negative feedback resistor 42 and connected to the second input terminal 32 through the tenth negative feedback resistor 43. The output of the third amplifier circuit 41 is connected to the third output terminal 46. The inputting eleventh resistor 44 is connected between the third input terminal 45 and the second input terminal 32.

The third amplifier circuit 41 has the same open loop gain as that of the first amplifier circuit 21. The ninth resistor 42 has the same resistance value as that of the first resistor 23, the tenth resistor 43 has the same resistance value as that of the second resistor 24, and the eleventh resistor 44 has the same resistance value as that of the third resistor 25.

Input signal sources 37 and 47 are connected between the first input terminal 31 and the second input terminal 32 and between the second input terminal 32 and third input terminal 45, respectively. Loads 39 and 48 such as a headphone having the same resistance value are connected between the first output terminal 33 and the second output terminal 34 and between the second output terminal 34 and the third output terminal 46, respectively. When a headphone is used as the loads 39 and 48, the input signal sources 37 and 47 are circuits for operating a stereo sound signal.

A small signal voltage from the input signal source 37 and an input DC bias voltage caused by the fourth and fifth resistors 26 and 27 are applied to the first amplifier circuit 27. A small signal voltage from the input signal source 47 and an input DC bias voltage caused by the fourth and fifth resistors 26 and 27 are applied to the third amplifier circuit 41. Only the input DC bias voltage caused by the fourth and fifth resistors 26 and 27 is applied to the second amplifier circuit 22. Since the input DC bias voltage applied to the first to third amplifier circuits 21, 22 and 41 are equal to each other and all of closed loop gains of the first to third amplifier circuits 21, 22 and 41 are equal, output offset voltages of the first to third amplifier circuits 21, 22 and 41 also become equal, so that all of DC output voltages derived from the first to third output terminals 33, 34 and 46 become equal. Thus, an amplified output of the small signal voltage from the input signal source 37 is applied to both ends of the load 39, and an amplified output of the input signal source 47 is applied to both ends of the load 48. Therefore, the stereo sound signal can be reproduced by a pair of headphones.

Meanwhile, when stereo reproduction is performed using the pair of headphones, crosstalk between right and left channels becomes a problem. If the output impedance of the second amplifier circuit 22 is lower, the crosstalk is improved. Thus, as described above, if the amount of the negative feedback of the amplifier circuit is increased, the output impedance thereof is decreased. Thus, when open loop gains of the first to third amplifier circuits 21, 22 and 41 are equal, the crossstalk can be improved if the amount of the negative feedback of the second amplifier circuit 22 is larger than those of the first and third amplifier circuits 21 and 41. In this case, since closed loop gain of the second amplifier circuit 22 is decreased, as compared with closed loop gains of the first and third amplifier circuits 21 and 41, the output offset voltages of the first and third amplifier circuits 21 and 41 are not equal to the output offset voltage of the second amplifier circuit 22. As a result, a small DC current flows in the loads 39 and 48. However, a small output DC difference voltage, for example, the difference voltage of approximately 30 mV hardly affects adversely the loads 39 and 48. Thus, if and when the crosstalk should be improved at the time of stereo reproduction, the closed loop gains of the first and third amplifier circuits 21 and 41 are not necessarily equal to the closed loop gain of the second amplifier circuit 22. In order to improve the crosstalk, the amount of the negative feedback of the second amplifier circuit may be increased, in which case the offset voltages are not equal.

Meanwhile, in any of the above described embodiments, it is desirable that the output impedance of the second amplifier circuit 22 is sufficiently smaller than the impedance of the load. For example, when the load impedance is 16Ω, it is desirable that the output impedance of the second amplifier circuit 22 is less than 1Ω.

Furthermore, although in the above described embodiment, the first to third amplifier circuits 21, 22 and 41 have the same open loop gain. If at least the closed loop gain (amplification degree) of the second amplifier circuit 22 equals the closed loop gains of the first amplifier circuit 21 and the third amplifier circuit 41, no DC current flows in the load. In addition, in order to improve the crosstalk, it is necessary that the output impedance of the second amplifier circuit 22 is decreased. If the open loop gain of the second amplifier circuit 22 is increased and the amount of the negative feedback is increased so that the closed loop gain of the second amplifier circuit 22 equal to those of the first and third amplifier circuits 21 and 41, the two conditions can be simultaneously satisfied.

The amplifier according to the present invention is also used for driving a load other than a headphone. In addition, the load also comprises various electronic circuits and electrical circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amplifier for amplifying an input signal voltage and supplying the same to a load, comprising:
   a first input terminal,
   a second input terminal,
   said input signal voltage being coupled between said first input terminal and said second input terminal,
   biasing means for applying a DC bias voltage to said input signal voltage,
   first amplifier means for amplifying the input signal voltage including said applied DC bias voltage,
   second amplifier means for amplifying only said DC bias voltage,
   a first output signal deriving means, including a first output terminal for deriving an output signal from said first amplifier means, and
   a second output signal deriving means, including a second output terminal for deriving an output signal from said second amplifier means,
   said load being connected between said first output terminal and said second output terminal.

2. An amplifier according to claim 1, wherein an output impedance of said second amplifier means is lower than an impedance or the load connected between said first output terminal and said second output terminal and is lower than an output impedance of said first amplifier means.

3. An amplifier according to claim 1, wherein said first amplifier means and said second amplifier means have the same closed loop amplification degree and the same input impedance.

4. An amplifier according to claim 2, wherein said second amplifier means is formed to have feedback with an amount that is larger than that of said first amplifier means, so that the output impedance of said second amplifier means becomes lower than that of said first amplifier means.

5. An amplifier for amplifying an input signal voltage and supplying the same to a load, comprising:
a first input terminal,
a second input terminal,
said input signal voltage being coupled between said first input terminal and said second input terminal,
biasing means for applying a DC bias voltage to said input signal voltage,
first amplifier means for amplifying the input signal voltage including said applied DC bias voltage,
second amplifier means for amplifying said DC bias voltage,
a first output signal deriving means, including a first output terminal for deriving an output signal from said first amplifier means,
a second output signal deriving means, including a second output terminal for deriving an output signal from said second amplifier means,
said load being connected between said first output terminal and said second output terminal,
said first amplifier means comprising:
a first amplifier circuit comprising one input terminal connected to said first input terminal, an other input terminal, and an output terminal connected to said first output terminal,
first resistor means connected between said other input terminal of said first amplifier circuit and said output terminal thereof,
second resistor means connected between said other input terminal of said first amplifier circuit and said second input terminal, and
third resistor means connected between said first input terminal and said second input terminal,
said second amplifier means comprising:
a second amplifier circuit comprising one input terminal, an other input terminal, and an output terminal connected to said second output terminal,
fourth resistor means connected between said other input terminal of said second amplifier circuit and said output terminal thereof,
fifth resistor means connected between said other input terminal of said second amplifier circuit and said second input terminal, and
sixth resistor means connected between said one input terminal of said second amplifier circuit and said second input terminal.

6. An amplifier according to claim 4, wherein said bias means comprises
a voltage source comprising a power supply terminal and a ground terminal,
seventh resistor means connected between said power supply terminal and said second input terminal, and
eighth resistor means connected between said ground terminal and said second input terminal.

7. An amplifier according to claim 5, wherein each of said first amplifier circuit and said second amplifier circuit comprises an operational amplifier.

8. An amplifier for amplifying an input signal voltage and supplying the same to a load, comprising:
a first input terminal,
a second input terminal,
said input signal voltage being coupled between said first input terminal and said second input terminal,
biasing means for applying a DC bias voltage to said input signal voltage,
first amplifier means for amplifying the input signal voltage including said applied DC bias voltage,
second amplifier means for amplifying said DC bias voltage,
a first output signal deriving means, including a first output terminal for deriving an output signal from said first amplifier means,
a second output signal deriving means, including a second output terminal for deriving an output signal from said second amplifier means,
said load being connected between said first output terminal and said second output terminal, said second amplifier means having an output impedance which is lower than an impedance of the load connected between said first output terminal and said second output terminal,
said first amplifier means comprising:
a first amplifier circuit comprising one input terminal connected to said first input terminal, an other input terminal, and an output terminal connected to said first output terminal,
first resistor means connected between said other input terminal of said first amplifier circuit and said output terminal thereof,
second resistor means connected between said other input terminal of said first amplifier circuit and said second input terminal,
third resistor means connected between said first input terminal and said second input terminal,
said second amplifier means comprising:
a second amplifier circuit comprising one input terminal, an other input terminal, and an output terminal connected to said second output terminal,
fourth resistor means connected between said other input terminal of said second amplifier circuit and said output terminal thereof,
fifth resistor means connected between said other input terminal of said second amplifier circuit and said second input terminal, and
sixth resistor means connected between said one input terminal of said second amplifier circuit and said second input terminal.

9. An amplifier according to claim 8, wherein each of said first amplifier circuit and said second amplifier circuit comprises an operational amplifier.

10. An amplifier for amplifying first and second input signal voltage and supplying respectively to first and second loads, comprising:
a first input terminal,
a second input terminal,
a third input terminal,
said first input signal voltage being coupled between said first input terminal and said second input terminal,
said second input signal voltage being coupled between said third input terminal and said second input terminal,
biasing means for applying a DC bias voltage to said first and second input signal voltages,
first amplifier means for amplifying the first input signal voltage including said applied DC bias voltage,
second amplifier means for amplifying said DC bias voltage, third amplifier means for amplifying said second input signal voltage including said applied DC bias voltage, said third amplifier means comprising the same amplification degree and an input impedance as those of said first amplifier means, and a first output signal deriving means, including a first output terminal for deriving an output signal from said first amplifier means, a second output signal deriving means, including a second output terminal for deriving an output signal from said second amplifier means, a third output signal deriving means, including a third output terminal for deriving an output signal from said third amplifier means, said first load being connected between said first output terminal and said second output terminal, and said second load being connected between said third output terminal and said second output terminal.

11. An amplifier according to claim 10, wherein:

said first amplifier means comprises:

a first amplifier circuit comprising one input terminal connected to said first input terminal, an other input terminal, and an output terminal connected to said first output terminal, said second amplifier means comprises:

a second amplifier circuit comprising one input terminal, an other input terminal, and an output terminal connected to said second output terminal, and said third amplifier means comprises:

a third amplifier circuit comprising one input terminal connected to said third input terminal, an other input terminal, and an output terminal connected to said third output terminal.

12. An amplifier according to claim 10, wherein said first amplifier means further comprises:

first resistor means connected between said other input terminal of said first amplifier circuit and said output terminal thereof, second resistor means connected between said other input terminal of said first amplifier circuit and said second input terminal, third resistor means connected between said first input terminal and said second input terminal, said second amplifier means further comprising:

fourth resistor means connected between said other input terminal of said second amplifier circuit and said output terminal thereof, fifth resistor means connected between said other input terminal of said second amplifier circuit and said second input terminal, and sixth resistor means connected between said one input terminal of said second amplifier circuit and said second input terminal, said biasing means comprising:

a power supply terminal and a ground terminal, seventh resistor means connected between said power supply terminal and said second input terminal, and eighth resistor means connected between said ground terminal and said second input terminal, said third amplifier means further comprising:

ninth resistor means connected between said other input terminal of said third amplifier circuit and said output terminal thereof, tenth resistor means connected between said other input terminal of said third amplifier circuit and said second input terminal; and eleventh resistor means connected between said third input terminal and said second input terminal.

13. An amplifier according to claim 10, wherein said third amplifier circuit comprises an operational amplifier.

14. An amplifier for amplifying an input signal voltage and supplying the same to a load, comprising:

first and second amplifier means each having an output terminal;

first means for applying a signal voltage and an input DC bias voltage to said first amplifier means;

second means for applying to said second amplifier means only an input DC bias voltage that is equal to that applied to said first amplifier means, said first and second amplifier means being formed to produce output bias voltages at said output terminals;

a load electrically connected between said output terminals; and means for setting said output bias voltages equal to each other so that no DC current flows to said load.

15. The amplifier as defined in claim 14, wherein said second amplifier means has an output impedance lower than an impedance of said load.

* * * * *